(12) United States Patent
Khan et al.

(10) Patent No.: US 8,384,184 B2
(45) Date of Patent: Feb. 26, 2013

(54) LATERALLY DIFFUSED METAL OXIDE SEMICONDUCTOR DEVICE

(75) Inventors: Tahir A. Khan, Tempe, AZ (US); Bernhard H. Grote, Phoenix, AZ (US); Vishnu K. Khemka, Phoenix, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 126 days.

(21) Appl. No.: 12/882,899

(22) Filed: Sep. 15, 2010

(65) Prior Publication Data
US 2012/0061758 A1    Mar. 15, 2012

(51) Int. Cl.
H01L 29/78    (2006.01)
(52) U.S. Cl. .................................. 257/492; 257/493
(58) Field of Classification Search .................. 257/492, 257/493
See application file for complete search history.

(56) References Cited

U.S. PATENT DOCUMENTS

| 6,069,396 | A  | * | 5/2000  | Funaki .......................... 257/492 |
| 6,693,339 | B1 |   | 2/2004  | Khemka et al. |
| 6,882,023 | B2 |   | 4/2005  | Khemka et al. |
| 7,180,158 | B2 | * | 2/2007  | Khemka et al. ............... 257/565 |
| 7,211,477 | B2 |   | 5/2007  | de Fresart et al. |
| 7,531,888 | B2 | * | 5/2009  | Cai ............................... 257/556 |
| 7,820,519 | B2 | * | 10/2010 | Roggenbauer et al. ....... 438/311 |
| 2008/0029814 | A1 |   | 2/2008  | Khalil |
| 2012/0043608 | A1 | * | 2/2012  | Yang et al. ..................... 257/336 |

OTHER PUBLICATIONS

Cezac, N., et al., A New Generation of Power Devices Based on the Concept of the "Floating Islands", Proc. 22nd International Conference on Microelectronics (MIEL 2000) vol. 2, NIS, Serbia, May 2000.
Alves, S. et al., Technological realization of low on-resistance FLYMOS transistors dedicated to automotive applications, Power Electronics and Applications, 2005 European Conference, Aug. 2006 I.
Weber, Y, et al., A New Optimzed 200V Low On-Resistance Power FLYMOSFET, Proceedings of the 20th Symposium on Power Semiconductor Devices & IC's, May 2008.
Parthasarathy, V., et al., A double RESURF LDMOS with drain profile engineering for improved ESD robustness, IEEE, Electron Device Letters,vol. 23 Issue Apr. 4, 2002.
Parthasarathy, V., et al., SOA improvement by a double RESURF LDMOS technique in a power IC technology, IEEE, Electron Devices Meeting, 2000. IEDM Technical Digest. International, Dec. 2000.

* cited by examiner

Primary Examiner — Eugene Lee
(74) Attorney, Agent, or Firm — Ingrassia Fisher & Lorenz, P.C.

(57) ABSTRACT

A semiconductor device and a related fabrication process are presented here. The device includes a support substrate, a buried oxide layer overlying the support substrate, a first semiconductor region located above the buried oxide layer and having a first conductivity type. The device also includes second, third, fourth, and fifth semiconductor regions. The second semiconductor region is located above the first semiconductor region, and it has a second conductivity type. The third semiconductor region is located above the second semiconductor region, and it has the first conductivity type. The fourth semiconductor region is located above the third semiconductor region, and it has the second conductivity type. The fifth semiconductor region extends through the fourth semiconductor region and the third semiconductor region to the second semiconductor region, and it has the second conductivity type.

15 Claims, 4 Drawing Sheets

LATERALLY DIFFUSED METAL OXIDE SEMICONDUCTOR DEVICE

TECHNICAL FIELD

Embodiments of the subject matter described herein relate generally to semiconductor devices. More particularly, embodiments of the subject matter relate to a laterally diffused metal oxide semiconductor (LDMOS) device.

BACKGROUND

Semiconductor devices and semiconductor device fabrication processes are well known. For example, metal oxide semiconductor field-effect transistors (MOSFETs) are commonly used in a variety of different applications. As another example, LDMOS devices are often used in applications, such as smart power technologies, where higher voltage rating is desired and device size is at a premium. Indeed, power LDMOS devices are becoming increasingly popular for power applications. Furthermore, some power LDMOS devices must be designed to operate in a "high-side configuration," which is a configuration in which all the device terminals are level shifted with respect to the substrate potential. A device that may be operated in a high-side configuration is said to be "high-side capable." High-side capable power LDMOS devices are designed to prevent a direct punch-through path from a body region of the power LDMOS device to an underlying, heavily doped substrate.

Existing technology attempts to satisfy high breakdown voltage requirements by utilizing a power LDMOS device having a reduced surface field (RESURF) structure. A power LDMOS device having a RESURF structure includes a first semiconductor region (which serves as a drift/RESURF region) having one conductivity type, and a second semiconductor region having a different conductivity type. The second region depletes the RESURF region from two different directions (bottom and side), allowing for a more uniform electric field distribution and thus reducing the peak electric field in the drift region, thereby allowing a higher breakdown voltage for the power LDMOS device. The RESURF structure just described is referred to herein as a "single RESURF" structure.

A "double RESURF" LDMOS structure, on the other hand, includes first and third semiconductor regions having one conductivity type, and a second semiconductor region having a different conductivity type. In the double RESURF structure, first and third semiconductor regions deplete the second semiconductor region, thus reducing the peak electric field in the second semiconductor region to a greater degree than is possible with a single RESURF structure. Transistor devices, including power LDMOS devices and bipolar transistors, having single or double RESURF structures, will be referred to herein as "RESURF transistors."

Lower "on" resistance and higher breakdown voltage characteristics are desirable in most practical LDMOS applications. An existing double RESURF LDMOS design utilizes a heavily doped n-type buried layer (NBL) that facilitates the double RESURF characteristics of the device. Unfortunately, the NBL limits the achievable breakdown voltage due to its depth relative to the source/body region near the surface of the device. Consequently, to achieve higher breakdown voltage, the thickness of the semiconductor material (e.g., p-type epitaxial semiconductor material) between the NBL and the source/body region could be increased. This solution, however, may not be feasible for higher breakdown voltage requirements, such as 80 volts and higher.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

For simplicity and clarity of illustration, the figures depict the general manner of construction and certain structural elements, and details of well known features and characteristics may be omitted to avoid clutter and confusion. Moreover, elements in the figures are not necessarily drawn to scale. For example, the dimensions of some of the elements in the figures may be exaggerated relative to other elements to help improve understanding of the described embodiments.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors and other semiconductor structures are well known and so, in the interest of brevity, many conventional steps will only be mentioned briefly herein or will be omitted entirely without providing the well known process details.

Figure 1:
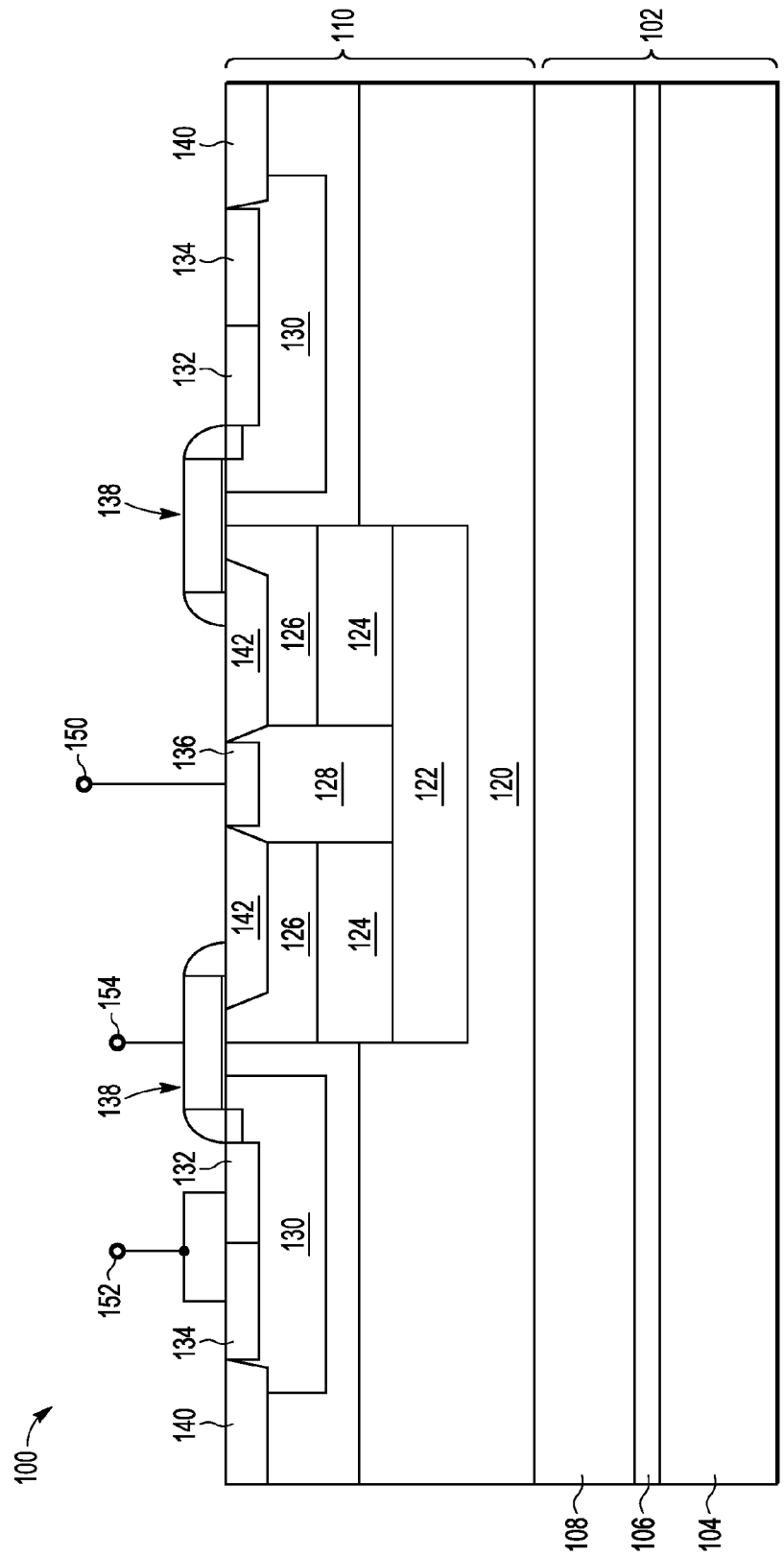
FIG. 1 is a cross sectional view of a portion of a semiconductor device according to an exemplary embodiment of the invention.

FIG. 1 is a simplified cross sectional view of a portion of a semiconductor device 100 according to one exemplary embodiment. Depending upon the particular implementation, the semiconductor device 100 could be a discrete component or part of an integrated circuit. Although not always required, this particular embodiment of the semiconductor device 100 is fabricated from a semiconductor-on-insulator (SOI) substrate 102 (typically realized as a silicon-on-insulator substrate), which includes a support layer 104 and/or a support substrate, a buried insulator layer 106 overlying the support layer 104, and a thin layer of semiconductor material 108 overlying the buried insulator layer 106. The buried insulator layer 106 is typically realized as a buried oxide (BOX) layer, and the layer of semiconductor material is usually realized as a layer of silicon material. The horizontal line in FIG. 1 indicates the boundary of the layer of semiconductor material 108. The semiconductor device 100 also includes additional semiconductor material 110 overlying the layer of semiconductor material 108 and, therefore, located above the buried insulator layer 106. In practice, this additional semiconductor material 110 may include one or more layers of the same or different types of semiconductor material, as explained in more detail below. In this regard, the additional semiconductor material 110 may be formed by epitaxial growth (in one or more steps) on the layer of semiconductor material 108. Accordingly, the additional semiconductor material 110 may be referred to herein as "epitaxially grown" semiconductor material.

The material used for the layer of semiconductor material 108 and the additional semiconductor material 110 is preferably a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material used for the semiconductor device 100 can be doped to be either n-type or p-type, but is typically p-type. As used here, an n-type semiconductor material is a semiconductor material that has an abundance of mobile or "carrier" electrons in the material, while a p-type semiconductor material is a semiconductor material that has an abundance of electron acceptors or holes in the material. An n-type silicon material can be formed by introducing an appropriate impurity species (e.g., phosphorus, arsenic, or antimony) into the silicon material, and a p-type silicon material can be formed by introducing an appropriate impurity species (e.g., boron or aluminum) into the silicon material. For this particular embodiment, the layer of semiconductor material 108 is a lightly doped p-type material having a doping concentration within the range of about $1 \times 10^{15}$ cm$^{-3}$ to $4 \times 10^{15}$ cm$^{-3}$, and the additional semiconductor material 110 is also a lightly doped p-type material having the same (or a similar) doping concentration.

It should be appreciated that although the figures depict various n-type and p-type semiconductor regions in a defined and regular arrangement and orientation, in reality these regions can be formed by implanting ions of an appropriate impurity species into semiconductor material (using specified implantation energy and doses, which may vary during the creation of a given region). In other embodiments, these regions may be formed by other doping methods other than implantation. Consequently, the boundary of a given n-type or p-type region need not (and typically will not) be as precisely defined as illustrated here. Indeed, the doping profile within a given region may vary with its depth, width, and/or other dimensions, and the transition between adjacent regions may be somewhat gradual, smooth, or tapered rather than immediate and abrupt as depicted in the figures.

The embodiment of the semiconductor device 100 depicted in FIG. 1 generally includes, without limitation: a first semiconductor region 120; a second semiconductor region 122; a third semiconductor region 124; a fourth semiconductor region 126; a fifth semiconductor region 128; a sixth semiconductor region 130; a first semiconductor contact region 132; a second semiconductor contact region 134; and a third semiconductor contact region 136. It should be appreciated that the sixth semiconductor region 130 is realized as a ring that encircles the interior regions of the semiconductor device 100 (e.g., the fourth semiconductor region 126 and the fifth semiconductor region 128). Consequently, the sixth semiconductor region 130 appears as two separate regions in the cross sectional view of FIG. 1. Similarly, the first semiconductor contact region 132 and the second semiconductor contact region 134 are formed as rings that encircle the interior regions of the semiconductor device 100. Therefore, the semiconductor contact regions 132, 134 are depicted in a segmented fashion in the cross sectional view of FIG. 1.

The illustrated embodiment of the semiconductor device 100 also includes a gate electrode structure 138. Although the gate electrode structure 138 is realized as a ring-shaped element, it appears segmented in the cross sectional view of FIG. 1 (as explained above for the sixth semiconductor region 130). In practice, the gate electrode structure 138 can be formed using a polycrystalline silicon material, which is separated from the underlying semiconductor material by a thin dielectric layer, e.g., a gate oxide layer. This gate oxide can be thermally grown or deposited, in accordance with conventional techniques.

The semiconductor device 100 includes an isolation region 140 that functions to electrically isolate the semiconductor device from other devices and/or components (not shown) that might be formed elsewhere on the same wafer. The semiconductor device 100 also includes an isolation region 142 that functions as the field drift region used to reduce surface electric field. In typical deployments, the isolation regions 140, 142 are realized using field oxide or shallow trench isolation (STI) oxide, as is well understood. As shown in FIG. 1, the polycrystalline silicon material of the gate electrode structure extends from the first semiconductor contact region 132 (the source region) to roughly the center of the isolation region 142.

It should be appreciated that the semiconductor device 100 represents an embodiment of RESURF transistor structure. More specifically, the semiconductor device 100 represents an embodiment of a double-double RESURF LDMOS transistor structure. In this regard, the third semiconductor contact region 136 may serve as a drain contact for coupling to a suitable drain voltage terminal 150, and the first and second semiconductor contact regions 132, 134 may be tied together to serve as a body/source contact for coupling to a suitable body/source voltage terminal 152. Moreover, the gate electrode structure 138 may be coupled to a suitable gate voltage terminal 154. The voltages applied to the drain voltage terminal 150, the body/source voltage terminal 152, and the gate voltage terminal 154 will influence the operating characteristics of the semiconductor device.

Referring again to the illustrated configuration of the semiconductor device 100, the additional semiconductor material 110 has a first conductivity type (which is p-type for this particular example). The first semiconductor region 120 is realized as a section or a portion of the additional semiconductor material 110. In other words, at least some of the additional semiconductor material 110 forms the first semiconductor region 120, which need not be precisely defined as a specific volume within the additional semiconductor material 110. Accordingly, the first semiconductor region 120 has a first conductivity type (which is p-type for this particular example). As shown in FIG. 1, the first semiconductor region 120 is located above the buried insulator layer 106 and above the layer of semiconductor material 108. Moreover, at least a portion of the first semiconductor region 120 is located below the second semiconductor region 122.

The second semiconductor region 122 is also located in the additional semiconductor material 110, however, it has a second conductivity type (which is n-type for this particular example). In practice, the second semiconductor region 122 may be formed as an implant region by implanting a portion of the additional semiconductor material 110 with an appropriate impurity species such that the second semiconductor region 122 has a doping concentration within the range of about $1\times10^{16}$ cm$^{-3}$ to $1\times10^{17}$ cm$^{-3}$. The second semiconductor region 122 is generally located above the first semiconductor region 120, below the third semiconductor region 124, and below the fifth semiconductor region 128. Although not always necessary, the second semiconductor region 122 is at least partially contiguous with the first semiconductor region 120. Moreover, in certain embodiments (such as the illustrated embodiment), the second semiconductor region 122 is formed such that little to no portion of it is located under the sixth semiconductor region 130. In other words, the inner boundary or edge of the ring-shaped sixth semiconductor region 130 does not overlap any section of the outer boundary or edge of the second semiconductor region 122. In other exemplary embodiments, however, the second semiconductor region 122 could extend laterally (e.g., horizontally in FIG. 1) below, and possibly beyond, the sixth semiconductor region 130. The height of the second semiconductor region 122 (e.g., the vertical dimension in FIG. 1) may be within the range of about 1.0 µm to about 2.0 µm, without limitation.

The third semiconductor region 124 is located in the additional semiconductor material 110, and it has the first conductivity type (p-type for this example). In practice, the third semiconductor region 124 may be formed as an implant region by implanting a portion of the additional semiconductor material 110 with an appropriate impurity species such that the third semiconductor region 124 has a doping concentration within the range of about $1\times10^{16}$ cm$^{-3}$ to $1\times10^{17}$ cm$^{-3}$. The third semiconductor region 124 is generally located above the second semiconductor region 122 and below the fourth semiconductor region 126. Although not always necessary, the third semiconductor region 124 is at least partially contiguous with the second semiconductor region 122. In certain embodiments (such as the illustrated embodiment), the third semiconductor region 124 is formed such that little to no portion of it is located under the sixth semiconductor region 130, as described above for the second semiconductor region 122. Although not always required, the lateral boundary of the third semiconductor region 124 is aligned with the lateral boundary of the second semiconductor region 122 (as depicted in FIG. 1). In other exemplary embodiments, however, the second and third semiconductor regions 122, 124 need not share a common lateral boundary and/or the third semiconductor region 124 could extend laterally below, and possibly beyond, the sixth semiconductor region 130. The height of the third semiconductor region 124 (e.g., the vertical dimension in FIG. 1) may be within the range of about 1.0 µm to about 2.0 µm, without limitation. Moreover, in certain embodiments the second and third semiconductor regions 122, 124 have the same nominal height.

The fourth semiconductor region 126 is also located in the additional semiconductor material 110, but it has the second conductivity type (n-type for this example). In practice, the fourth semiconductor region 126 may be formed as an implant region by implanting a portion of the additional semiconductor material 110 with an appropriate impurity species such that the fourth semiconductor region 126 has a doping concentration within the range of about $1\times10^{16}$ cm$^{-3}$ to $1\times10^{17}$ cm$^{-3}$. The fourth semiconductor region 126 is generally located above the third semiconductor region 124, near or at the upper surface of the semiconductor device 100. Although not always necessary, the fourth semiconductor region 126 is at least partially contiguous with the third semiconductor region 124. In certain embodiments (such as the illustrated embodiment), the fourth semiconductor region 126 is adjacent to and separated from the sixth semiconductor region 130. In other embodiments, the fourth semiconductor region 126 may be immediately adjacent to (i.e., contiguous with) the sixth semiconductor region 130. Although not always required, the lateral boundary of the fourth semiconductor region 126 is aligned with the lateral boundaries of the second and third semiconductor regions 122, 124 (as depicted in FIG. 1). In other exemplary embodiments, however, the second, third, and fourth semiconductor regions 122, 124, 126 need not share a common lateral boundary. The height of the fourth semiconductor region 126 (e.g., the vertical dimension in FIG. 1) may be within the range of about 1.0 µm to about 2.0 µm, without limitation. Moreover, in certain embodiments the second, third, and fourth semiconductor regions 122, 124, 126 have the same nominal height.

The fifth semiconductor region 128 is located in the additional semiconductor material 110, and it has the second conductivity type (n-type for this example). In practice, the fifth semiconductor region 128 may be formed as an implant region by implanting a portion of the additional semiconductor material 110 with an appropriate impurity species such that the fifth semiconductor region 128 has a doping concentration within the range of about $5\times10^{16}$ cm$^{-3}$ to $8\times10^{17}$ cm$^{-3}$. The fifth semiconductor region 128 is generally located above the second semiconductor region 122, and it extends from a point at or near the upper surface of the semiconductor device 100 to the second semiconductor region 122. In this regard, the fifth semiconductor region 128 can be formed such that it extends through the third and fourth semiconductor regions 124, 126, and such that portions of the third and fourth semiconductor regions 124, 126 encircle the fifth semiconductor region 128. Thus, in the illustrated embodiment, the fifth semiconductor region 128 is adjacent to and at least partially contiguous with both the third and fourth semiconductor regions 124, 126.

For this exemplary embodiment, the third semiconductor contact region 136 is associated with the drain region of the semiconductor device 100. The third semiconductor contact region 136 is located in the fifth semiconductor region 128, at or near the upper surface of the semiconductor device 100, and it has the second conductivity type (n-type for this example). In practice, the third semiconductor contact region 136 may be formed as an implant region by implanting a portion of the additional semiconductor material 110 with an appropriate impurity species such that the third semiconductor contact region 136 has a relatively heavy doping concentration within the range of about $1\times10^{20}$ cm$^{-3}$ to $1\times10^{21}$ cm$^{-3}$. As mentioned above, the third semiconductor contact region 136 may be coupled to the drain voltage terminal 150. Moreover, the third semiconductor contact region 136 is electrically coupled to the fifth semiconductor region 128, which in turn is electrically coupled to the second semiconductor region 122 and the fourth semiconductor region 126.

The sixth semiconductor region 130 is located in the additional semiconductor material 110, and it has the first conductivity type (p-type for this example). In practice, the sixth semiconductor region 130 may be formed as an implant region by implanting a portion of the additional semiconductor material 110 with an appropriate impurity species such that the sixth semiconductor region 130 has a doping concentration within the range of about $5\times10^{16}$ cm$^{-3}$ to $8\times10^{17}$ cm$^{-3}$. The sixth semiconductor region 130 is located at or near the upper surface of the semiconductor device 100, and adjacent to the fourth semiconductor region 126. For this particular embodiment, the sixth semiconductor region 130 resembles a ring that encircles the fourth semiconductor region 126. Moreover, the fourth semiconductor region 126 separates the fifth semiconductor region 128 from the sixth semiconductor region 130, as depicted in FIG. 1. In other words, the sixth semiconductor region 130 is spaced away from the fifth semiconductor region 128, and the fourth semiconductor region 126 resides between the fifth and sixth semiconductor regions 128, 130. In practice, the sixth semiconductor region 130 can be formed to a depth of about 1.0 µm to about 2.0 µm, without limitation. Therefore, depending upon the particular embodiment, the lowermost boundary of the sixth semiconductor region 130 may be higher than the lowermost boundary of the fourth semiconductor region 126, or it may extend downward to any desired depth.

For this example, the first semiconductor contact region 132 is associated with the source region of the semiconductor device 100. The first semiconductor contact region 132 is located in the sixth semiconductor region 130, at or near the upper surface of the semiconductor device 100, and it has the second conductivity type (n-type for this example). In practice, the first semiconductor contact region 132 may be formed as an implant region by implanting a portion of the additional semiconductor material 110 with an appropriate impurity species such that the first semiconductor contact region 132 has a relatively heavy doping concentration within the range of about $1 \times 10^{20}$ cm$^{-3}$ to $1 \times 10^{21}$ cm$^{-3}$. As mentioned above, the first semiconductor contact region 132 may be coupled to the body/source voltage terminal 152.

For this example, the second semiconductor contact region 134 is associated with the body region of the semiconductor device 100. The second semiconductor contact region 134 is located in the sixth semiconductor region 130, at or near the upper surface of the semiconductor device 100, and adjacent to the first semiconductor contact region 132. The second semiconductor contact region 134 has the first conductivity type (p-type for this example). In practice, the second semiconductor contact region 134 may be formed as an implant region by implanting a portion of the additional semiconductor material 110 with an appropriate impurity species such that the second semiconductor contact region 134 has a relatively heavy doping concentration within the range of about $1 \times 10^{20}$ cm$^{-3}$ to $1 \times 10^{21}$ cm$^{-3}$. As mentioned above, the second semiconductor contact region 134 may be coupled to the body/source voltage terminal 152. Moreover, the second semiconductor contact region 134 is electrically coupled to the sixth semiconductor region 130.

The different doping concentrations of the various semiconductor regions of the semiconductor device 100 cooperate to provide the double-double RESURF LDMOS operating characteristics. In this regard, the fifth semiconductor region 128 is more heavily doped than any of the first, second, third, or fourth semiconductor regions 120, 122, 124, 126. Likewise, the sixth semiconductor region 130 is more heavily doped than any of the first, second, third, or fourth semiconductor regions 120, 122, 124, 126. Moreover, the additional semiconductor material 110 (and, therefore, the first semiconductor region 120) is more lightly doped than any of the second, third, fourth, fifth, or sixth semiconductor regions 122, 124, 126, 128, 130.

As power technologies develop, power applications require smaller and smaller power LDMOS devices with improved voltage capability. High voltage power LDMOS devices in deep sub-micrometer (sub-micron) technologies are difficult to design, however, in part due to limited epitaxial layer thickness and limited thermal budget. Accordingly, there is a need for a double RESURF LDMOS device having improved on-state performance (low on-state resistance) characteristics and having a structure that can tolerate relatively high breakdown voltage requirements.

The semiconductor device 100 exhibits improved safe operating area (SOA) and electrostatic discharge (ESD) capabilities by utilizing a deep drain structure for LDMOS design. The semiconductor device 100 employs a double-double RESURF LDMOS arrangement to further improve the off-state capability enabled by a uniform potential distribution with optimized on-state performance. The presence of the p-type semiconductor material under the n-type second semiconductor region 122, along with the buried insulator layer 106, retains the double-double RESURF action and, in turn, a more uniform electric field. More specifically, the third semiconductor region 124 is depleted from both the overlying fourth semiconductor region 126 and the underlying second semiconductor region 122, while the second semiconductor region 122 is depleted from both the overlying third semiconductor region 124 and the underlying first semiconductor region 120.

Notably, the semiconductor device 100 employs the following vertical arrangement (from top to bottom): second conductivity type region; first conductivity type region; second conductivity type region; first conductivity type region; buried insulator layer. The semiconductor device 100 utilizes thick SOI technology that allows for full high-side capability without requiring the use of a heavily doped n-type buried layer (NBL). In other words, the buried insulator layer obviates the need for an NBL. Accordingly, because an NBL is not required for high side capability, there is no maximum voltage restriction due to spacing between the NBL and body well and, therefore, no thicker epitaxial material requirement for higher breakdown voltage.

Figure 2:
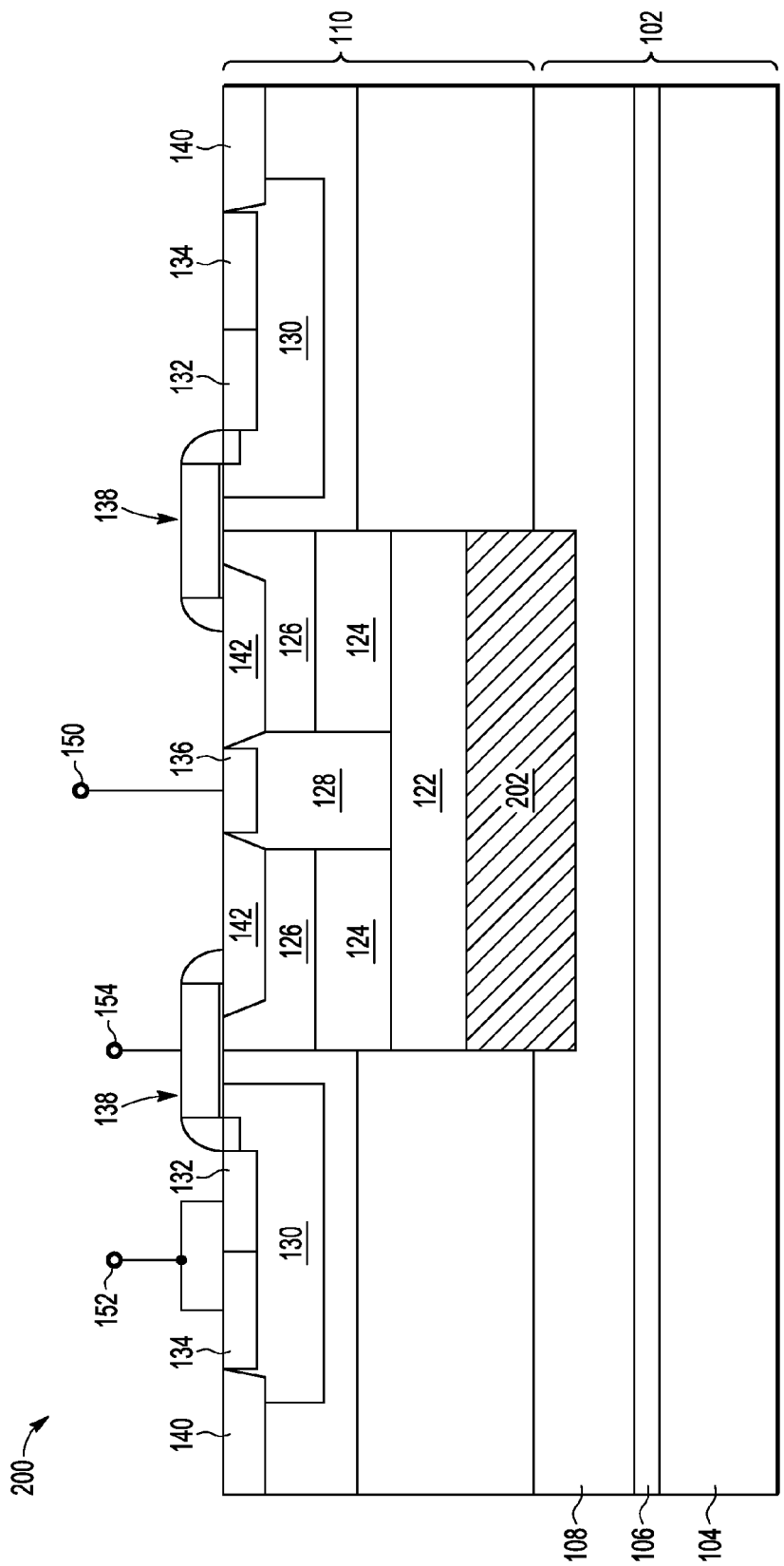
FIG. 2 is a cross sectional view of a portion of a semiconductor device according to another exemplary embodiment of the invention.

FIG. 2 is a cross sectional view of a portion of a semiconductor device 200 according to another exemplary embodiment of the invention. Many of the features, elements, and structures of the semiconductor device 200 are similar or identical to those described above for the semiconductor device 100, and such common items will not be redundantly described in detail here. The semiconductor device 200 differs from the semiconductor device 100 in that it includes an eighth semiconductor region 202 located in the additional semiconductor material 110, and having the first conductivity type (p-type for this example). Notably, the eighth semiconductor region 202 may be used in lieu of or in addition to the first semiconductor region 120 (not shown in FIG. 2). In practice, the eighth semiconductor region 202 may be formed as an implant region by implanting a portion of the additional semiconductor material 110 with an appropriate impurity species such that the eighth semiconductor region 202 has a doping concentration within the range of about $1 \times 10^{16}$ cm$^{-3}$ to $1 \times 10^{17}$ cm$^{-3}$. The higher doping concentration in the eighth semiconductor region 202 (relative to the doping concentration in the surrounding additional semiconductor material 110) results in a stronger depletion into the second semiconductor region 122.

For the embodiment shown in FIG. 2, the eighth semiconductor region 202 is located above the buried insulator layer 106, but below the second semiconductor region 122. Although not always necessary, the eighth semiconductor region 202 is at least partially contiguous with the second semiconductor region 122. Moreover, although not always required, the lateral boundary of the eighth semiconductor region 202 is aligned with the lateral boundaries of the second, third, and fourth semiconductor regions 122, 124, 126 (as depicted in FIG. 1). In other exemplary embodiments, however, the second, third, fourth, and eighth semiconductor regions 122, 124, 126, 202 need not share a common lateral boundary. The height of the eighth semiconductor region 202 (e.g., the vertical dimension in FIG. 2) may be within the range of about 1.0 µm to about 2.0 µm, without limitation. In certain embodiments, the second, third, fourth, and eighth semiconductor regions 122, 124, 126, 202 have the same nominal height.

Figure 3:
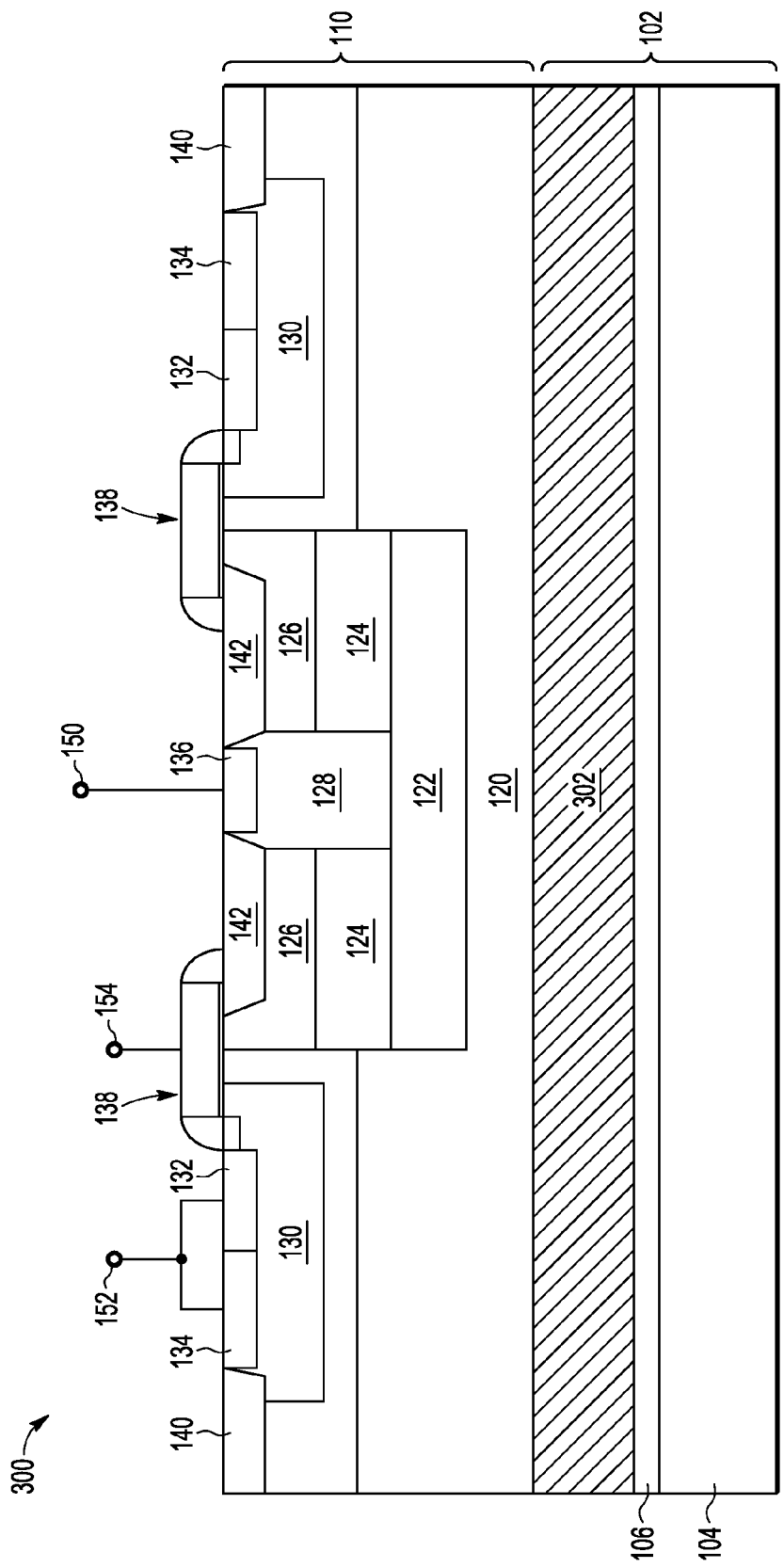
FIG. 3 is a cross sectional view of a portion of a semiconductor device according to yet another exemplary embodiment of the invention.

FIG. 3 is a cross sectional view of a portion of a semiconductor device 300 according to another exemplary embodiment of the invention. Many of the features, elements, and structures of the semiconductor device 300 are similar or identical to those described above for the semiconductor device 100, and such common items will not be redundantly described in detail here. The semiconductor device 300 differs from the semiconductor device 100 in that it includes an eighth semiconductor region 302 located in the additional semiconductor material 110, and having the first conductivity type (p-type for this example). For this embodiment, the eighth semiconductor region 302 is used with the first semiconductor region 120, which resides between the second and eighth semiconductor regions 122, 302. In practice, the eighth semiconductor region 302 may be formed as a implant region by blanket implanting the additional semiconductor material 110 with an appropriate impurity species such that the eighth semiconductor region 302 has a doping concentration within the range of $1\times10^{16}$ cm$^{-3}$ to $1\times10^{17}$ cm$^{-3}$. The higher doping concentration in the eighth semiconductor region 302 (relative to the doping concentration in the surrounding additional semiconductor material 110) results in a stronger depletion into the second semiconductor region 122.

For the embodiment shown in FIG. 3, the eighth semiconductor region 302 is located above the buried insulator layer 106, but below the first semiconductor region 120. In alternate embodiments, the eighth semiconductor region 302 is at least partially contiguous with the second semiconductor region 122, i.e., there is little to no "gap" between the second and eighth semiconductor regions 122, 302. Notably, the eighth semiconductor region 302 laterally extends beyond the lateral boundaries of the second, third, and fourth semiconductor regions 122, 124, 126. Indeed, due to the blanket nature of the implant used to create the eighth semiconductor region 302, it extends below (and possibly beyond) the sixth semiconductor region 130. The height of the eighth semiconductor region 302 (e.g., the vertical dimension in FIG. 3) may be within the range of about 1.0 µm to about 2.0 µm, without limitation. In certain embodiments, the second, third, fourth, and eighth semiconductor regions 122, 124, 126, 302 have the same nominal height.

Figure 4:
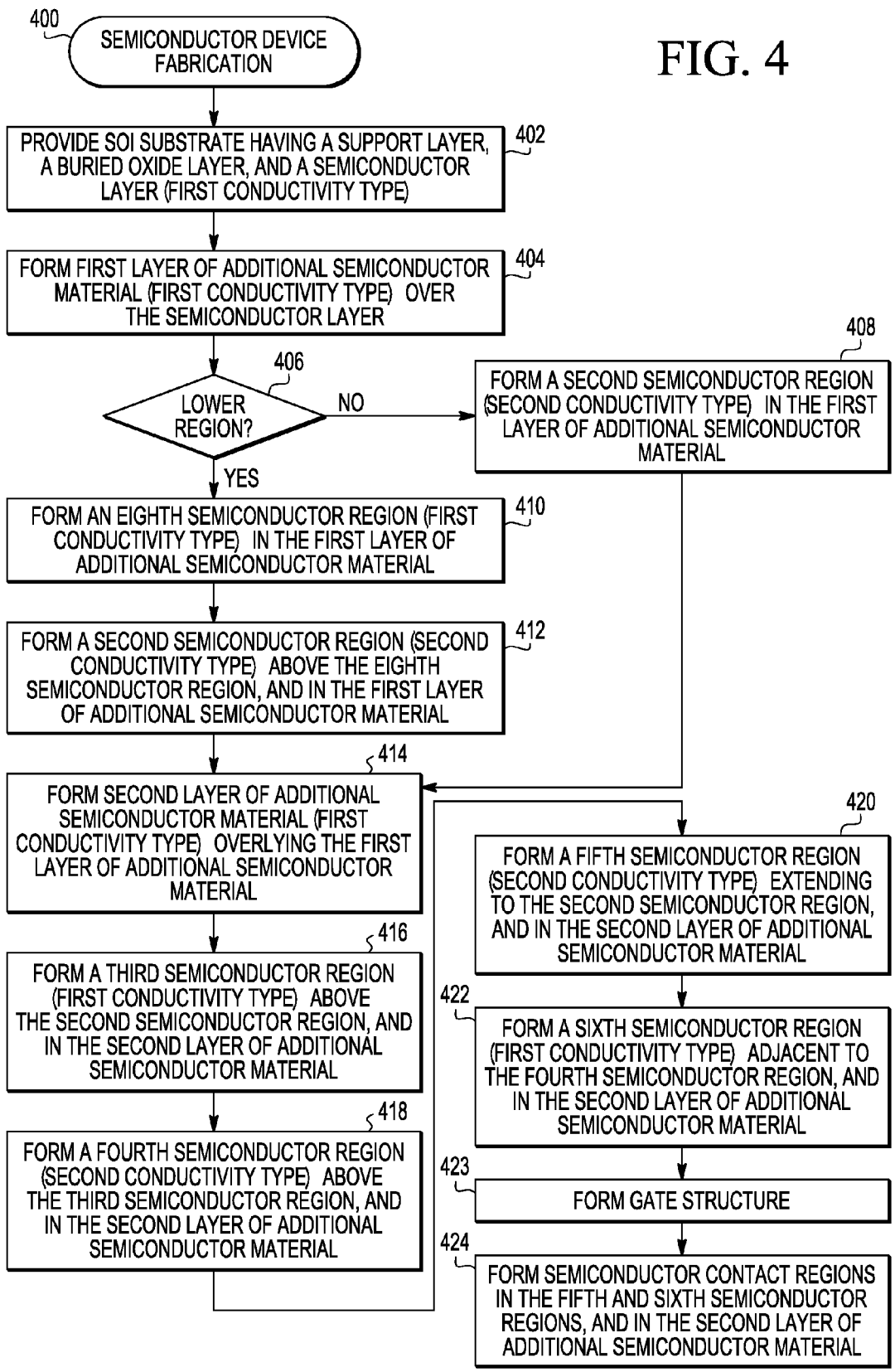
FIG. 4 is a flow chart that illustrates a method of fabricating a semiconductor device according to an exemplary embodiment of the invention.

Refer now to FIG. 4, which is a flow chart that illustrates a process 400 of fabricating a semiconductor device according to an exemplary embodiment of the invention. The process 400 may begin by providing an appropriate SOI substrate having a support layer, a buried insulator layer (e.g., a BOX layer) overlying the support layer, and a layer of semiconductor material overlying the buried insulator layer (task 402). In practice, the SOI substrate could be obtained from a wafer vendor or supplier. In a typical embodiment, the thickness of the original layer of semiconductor material is about 1.5 µm. The process 400 may continue by forming a first layer of additional semiconductor material overlying the semiconductor material on the SOI substrate (task 404), where the additional semiconductor material has a first conductivity type (which is p-type for this example). Task 404 may be performed by epitaxially growing an initial layer of additional semiconductor material on the existing semiconductor material of the SOI substrate, using well known epitaxial growth technology and processing. Moreover, the additional semiconductor material may be in-situ doped or it may be doped by ion implantation after it has been grown. In a typical embodiment, the thickness of the initial layer of additional semiconductor material is about 2.0 µm. Notably, at least a portion of the epitaxially grown semiconductor material may serve as a first semiconductor region of the resulting semiconductor device (e.g., the first semiconductor region 120 shown in FIG. 1 and FIG. 3).

As explained above with reference to FIG. 2 and FIG. 3, the resulting semiconductor device may include an optional lower semiconductor region having the first conductivity type (e.g., the eighth semiconductor region 202, 302). If this lower region will not be fabricated (query task 406), then the process 400 continues by forming a second semiconductor region (e.g., the second semiconductor region 122) in the initial layer of additional semiconductor material (task 408). In certain embodiments, this second semiconductor region can be formed by creating an appropriate ion implantation mask that defines the desired implantation boundary, and then implanting ions of an impurity species into the initial layer of additional semiconductor material such that the second semiconductor region has the second conductivity type (n-type for this example). After formation of the second semiconductor region, the process 400 performs a task 414 (described below).

If, however, a lower semiconductor region will be fabricated (query task 406), then the process continues by forming an eighth semiconductor region (e.g., the eighth semiconductor region 202, 302) in the initial layer of additional semiconductor material (task 410). In some embodiments, this eighth semiconductor region is formed by creating an appropriate ion implantation mask that defines the desired implantation boundary, and then implanting ions of an impurity species into the initial layer of additional semiconductor material such that the eighth semiconductor region has the first conductivity type (p-type for this example). In other embodiments, the eighth semiconductor region is formed by a blanket ion implantation procedure without using any ion implantation mask, such that a blanket layer having the first conductivity type is created in the initial layer of additional semiconductor material.

After formation of the eighth semiconductor region, the process 400 may continue by forming a second semiconductor region (e.g., the second semiconductor region 122) in the initial layer of additional semiconductor material and above the eighth semiconductor region (task 412). In certain embodiments, this second semiconductor region can be formed by creating an appropriate ion implantation mask that defines the desired implantation boundary, and then implanting ions of an impurity species into the initial layer of additional semiconductor material such that the second semiconductor region has the second conductivity type (n-type for this example).

After formation of the second semiconductor region (by way of task 408 or task 412), the process 400 forms a second layer of additional semiconductor material (having the first conductivity type, e.g., p-type) overlying the initial layer of additional semiconductor material (task 414). In practice, the second layer of additional semiconductor material and the initial layer of additional semiconductor material are formed from the same type of material. Task 414 may be performed by epitaxially growing the second layer of additional semiconductor material on the exposed semiconductor material, using well known epitaxial growth technology and processing. Moreover, the additional semiconductor material may be in-situ doped or it may be doped by ion implantation after it has been grown. In a typical embodiment, the thickness of the second layer of additional semiconductor material is about 2.5 µm. The use of two (or more) distinct epitaxial growth steps is desirable to accommodate ion implantation for semiconductor regions that might otherwise be too deep for some ion implantation tools.

The process 400 may continue by forming a third semiconductor region (e.g., the third semiconductor region 124) in the second layer of additional semiconductor material (task 416) and by forming a fourth semiconductor region (e.g., the fourth semiconductor region 126) in the second layer of additional semiconductor material (task 418). The third semiconductor region has the first conductivity type (p-type in this example), and it is located above the second semiconductor region. The fourth semiconductor region has the second conductivity type (n-type in this example), and it is located above the third semiconductor region. In certain embodiments, the third and fourth semiconductor regions can be formed by creating an appropriate ion implantation mask that defines the desired implantation boundary, and then performing a chain implant procedure to create the p-type implant for the third semiconductor region and the n-type implant for the fourth semiconductor region. For the illustrated example, the ion implantation mask used to implant the third and fourth semiconductor regions 124, 126 defines a ring shaped opening such that a portion of underlying material within the central portion of the ring remains protected.

The process 400 also forms a fifth semiconductor region (e.g., the fifth semiconductor region 128) in the second layer of additional semiconductor material (task 420) and a sixth semiconductor region (e.g., the sixth semiconductor region 130) in the second layer of additional semiconductor material (task 422). As described above, the fifth semiconductor region extends through the third and fourth semiconductor regions to the second semiconductor region, and the fifth semiconductor is formed such that it has the second conductivity type (n-type for this example). The sixth semiconductor region is formed around and adjacent to the fourth semiconductor region, and the sixth semiconductor region is formed such that it has the first conductivity type (p-type for this example). The fifth and sixth semiconductor regions can be created by forming ion implantation masks and by implanting ions of the appropriate impurity species into the second layer of additional semiconductor material.

Next, the process 400 forms the gate structure for the device (e.g., the gate electrode structure 138), in accordance with an appropriate gate fabrication procedure or module (task 423). For example, task 423 may involve various material deposition, photolithography, and etching steps that result in the creation of a ring-shaped gate insulator, a ring-shaped polycrystalline silicon gate electrode, and sidewall spacers adjacent the sidewalls of the gate electrode (see FIG. 1). As shown in FIG. 1, the resulting gate electrode structure 138 "straddles" or "bridges" the fourth and sixth semiconductor regions 126, 130.

The process 400 can then perform a task 424 to create semiconductor contact regions in the fifth semiconductor region (e.g., the contact region 136) and in the sixth semiconductor region (e.g., the contact regions 132, 134). These semiconductor contact regions can be created by forming ion implantation masks and by implanting ions of the appropriate impurity species into the fifth and sixth semiconductor regions. For this particular example, these implanting steps create the source, drain, and body implants for the device.

In summary, systems, devices, and methods configured in accordance with exemplary embodiments relate to:

A semiconductor device having: a semiconductor-on-insulator substrate comprising a support layer, a buried insulator layer overlying the support layer, and a layer of semiconductor material overlying the buried insulator layer; additional semiconductor material overlying the layer of semiconductor material, the additional semiconductor material comprising a first semiconductor region having a first conductivity type; a second semiconductor region located in the additional semiconductor material and having a second conductivity type; a third semiconductor region located in the additional semiconductor material above the second semiconductor region and having the first conductivity type; a fourth semiconductor region located in the additional semiconductor material above the third semiconductor region and having the second conductivity type; and a fifth semiconductor region located in the additional semiconductor material above the second semiconductor region and having the second conductivity type, the fifth semiconductor region being adjacent to both the third semiconductor region and the fourth semiconductor region.

The semiconductor device may further include a semiconductor contact region located in the fifth semiconductor region, and having the second conductivity type. In such a device, the fifth semiconductor region could electrically couple the second semiconductor region and the fourth semiconductor region to the semiconductor contact region.

The semiconductor device may further include a sixth semiconductor region located in the additional semiconductor material adjacent to the fourth semiconductor region and having the first conductivity type. Such a device may further include a seventh semiconductor region located in the sixth semiconductor region and having the second conductivity type. In such a device, the fourth semiconductor region could separate the fifth semiconductor region from the sixth semiconductor region. An embodiment of such a device could be fabricated such that no portion of the second semiconductor region is located under the sixth semiconductor region. An embodiment of such a device could be fabricated such that no portion of the third semiconductor region is located under the sixth semiconductor region. Such a device may further include a gate structure that overlies a portion of the fourth semiconductor region and overlies a portion of the sixth semiconductor region. In such a device, the fifth semiconductor region could serve as a drain region of a transistor, the sixth semiconductor region could serve as a source region of the transistor, and the gate structure could serve as the gate of the transistor.

The semiconductor device may further include an eighth semiconductor region located in the additional semiconductor material above the buried insulator layer and below the second semiconductor region, and having the first conductivity type. In such a device, the eighth semiconductor region could laterally extend beyond lateral boundaries of the second semiconductor region, the third semiconductor region, and the fourth semiconductor region.

In certain embodiments, the fifth semiconductor region is more heavily doped than any of the second semiconductor region, the third semiconductor region, and the fourth semiconductor region, and the additional semiconductor material is more lightly doped than any of the second semiconductor region, the third semiconductor region, and the fourth semiconductor region.

A semiconductor device formed on a support substrate. The semiconductor device includes: a buried oxide layer overlying the support substrate; a first semiconductor region located above the buried oxide layer and having a first conductivity type; a second semiconductor region located above the first semiconductor region and having a second conductivity type; a third semiconductor region located above the second semiconductor region and having the first conductivity type; a fourth semiconductor region located above the third semiconductor region and having the second conductivity type; and a fifth semiconductor region extending through the fourth semiconductor region and the third semiconductor region to the second semiconductor region, and having the second conductivity type.

The semiconductor device may further include epitaxially grown semiconductor material located above the buried oxide layer, wherein: the first semiconductor region comprises a portion of the epitaxially grown semiconductor material; and the second semiconductor region, the third semiconductor region, the fourth semiconductor region, and the fifth semiconductor region are all located in the epitaxially grown semiconductor material.

The semiconductor device may further include a semiconductor contact region located in the fifth semiconductor region and having the second conductivity type, wherein the fifth semiconductor region electrically couples the second semiconductor region to the semiconductor contact region.

The semiconductor device may further include: a layer of semiconductor material overlying the buried oxide layer; and epitaxially grown semiconductor material overlying the layer of semiconductor material; wherein: the first semiconductor region comprises a portion of the epitaxially grown semiconductor material; and the second semiconductor region, the third semiconductor region, the fourth semiconductor region, and the fifth semiconductor region are all located in the epitaxially grown semiconductor material.

A method of fabricating a semiconductor device on a semiconductor-on-insulator substrate comprising a support layer, a buried insulator layer overlying the support layer, and a layer of semiconductor material overlying the buried insulator layer. The method involves: forming epitaxially grown semiconductor material overlying the layer of semiconductor material, the epitaxially grown semiconductor material having a first conductivity type, and at least a portion of the epitaxially grown semiconductor material serving as a first semiconductor region of the semiconductor device; forming a second semiconductor region in the epitaxially grown semiconductor material, the second semiconductor region located above the first semiconductor region and having a second conductivity type; forming a third semiconductor region in the epitaxially grown semiconductor material, the third semiconductor region located above the second semiconductor region and having the first conductivity type; forming a fourth semiconductor region in the epitaxially grown semiconductor material, the fourth semiconductor region located above the third semiconductor region and having the second conductivity type; and forming a fifth semiconductor region in the epitaxially grown semiconductor material, the fifth semiconductor region extending through the fourth semiconductor region and the third semiconductor region to the second semiconductor region, and having the second conductivity type.

The step of forming the epitaxially grown semiconductor material may involve: forming a first layer of epitaxially grown semiconductor material overlying the layer of semiconductor material; and forming a second layer of epitaxially grown semiconductor material overlying the first layer of epitaxially grown semiconductor material; wherein the second semiconductor region is formed in the first layer of epitaxially grown semiconductor material before forming the second layer of epitaxially grown semiconductor material; and the third semiconductor region, the fourth semiconductor region, and the fifth semiconductor region are formed in the second layer of epitaxially grown semiconductor material.

The method may further involve forming a semiconductor contact region in the fifth semiconductor region, the semiconductor contact region having the second conductivity type, wherein the fifth semiconductor region electrically couples the second semiconductor region to the semiconductor contact region.

While at least one exemplary embodiment has been presented in the foregoing detailed description, it should be appreciated that a vast number of variations exist. For example, although the example presented above is for an n-LDMOS device (where the "first conductivity type" is p-type and the "second conductivity type" is n-type), the techniques and technology described above also apply to a p-LDMOS device (where the "first conductivity type" is n-type and the "second conductivity type" is p-type). It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a semiconductor-on-insulator substrate comprising a support layer, a buried insulator layer overlying the support layer, and a layer of semiconductor material overlying the buried insulator layer;
additional semiconductor material overlying the layer of semiconductor material, the additional semiconductor material comprising a first semiconductor region having a first conductivity type;
a second semiconductor region located in the additional semiconductor material and having a second conductivity type;
a third semiconductor region located in the additional semiconductor material above the second semiconductor region and having the first conductivity type;
a fourth semiconductor region located in the additional semiconductor material above the third semiconductor region and having the second conductivity type;
a fifth semiconductor region located in the additional semiconductor material above the second semiconductor region and having the second conductivity type, the fifth semiconductor region being adjacent to both the third semiconductor region and the fourth semiconductor region; and
a sixth semiconductor region located in the additional semiconductor material adjacent to the fourth semiconductor region and having the first conductivity type, wherein no portion of the second semiconductor region is located under the sixth semiconductor region.

2. The semiconductor device of claim 1, further comprising a semiconductor contact region located in the fifth semiconductor region, and having the second conductivity type.

3. The semiconductor device of claim 2, wherein the fifth semiconductor region electrically couples the second semiconductor region and the fourth semiconductor region to the semiconductor contact region.

4. The semiconductor device of claim 1, further comprising a semiconductor contact region located in the sixth semiconductor region and having the second conductivity type.

5. The semiconductor device of claim 1, wherein the fourth semiconductor region separates the fifth semiconductor region from the sixth semiconductor region.

6. The semiconductor device of claim 1, wherein no portion of the third semiconductor region is located under the sixth semiconductor region.

7. The semiconductor device of claim 1, further comprising a gate structure that overlies a portion of the fourth semiconductor region and overlies a portion of the sixth semiconductor region.

8. The semiconductor device of claim 7, wherein:
the fifth semiconductor region serves as a drain region of a transistor;
the sixth semiconductor region serves as a source region of the transistor; and
the gate structure serves as the gate of the transistor.

9. The semiconductor device of claim 1, further comprising an eighth semiconductor region located in the additional semiconductor material above the buried insulator layer and below the second semiconductor region, and having the first conductivity type.

10. The semiconductor device of claim 1, wherein:
the fifth semiconductor region is more heavily doped than any of the second semiconductor region, the third semiconductor region, and the fourth semiconductor region; and
the additional semiconductor material is more lightly doped than any of the second semiconductor region, the third semiconductor region, and the fourth semiconductor region.

11. A semiconductor device formed on a support substrate, the semiconductor device comprising:
a buried oxide layer overlying the support substrate;
a first semiconductor region located above the buried oxide layer and having a first conductivity type;
a second semiconductor region located above the first semiconductor region and having a second conductivity type;
a third semiconductor region located above the second semiconductor region and having the first conductivity type;
a fourth semiconductor region located above the third semiconductor region and having the second conductivity type;
a fifth semiconductor region extending through the fourth semiconductor region and the third semiconductor region to the second semiconductor region, and having the second conductivity type; and
a sixth semiconductor region located in the additional semiconductor material adjacent to the fourth semiconductor region and having the first conductivity type, wherein no portion of the second semiconductor region is located under the sixth semiconductor region.

12. The semiconductor device of claim 11, further comprising epitaxially grown semiconductor material located above the buried oxide layer, wherein:
the first semiconductor region comprises a portion of the epitaxially grown semiconductor material; and
the second semiconductor region, the third semiconductor region, the fourth semiconductor region, and the fifth semiconductor region are all located in the epitaxially grown semiconductor material.

13. The semiconductor device of claim 11, further comprising a semiconductor contact region located in the fifth semiconductor region and having the second conductivity type, wherein the fifth semiconductor region electrically couples the second semiconductor region to the semiconductor contact region.

14. The semiconductor device of claim 11, further comprising:
a layer of semiconductor material overlying the buried oxide layer; and
epitaxially grown semiconductor material overlying the layer of semiconductor material; wherein:
the first semiconductor region comprises a portion of the epitaxially grown semiconductor material; and
the second semiconductor region, the third semiconductor region, the fourth semiconductor region, and the fifth semiconductor region are all located in the epitaxially grown semiconductor material.

15. A semiconductor device comprising:
a semiconductor-on-insulator substrate comprising a support layer, a buried insulator layer overlying the support layer, and a layer of semiconductor material overlying the buried insulator layer;
additional semiconductor material overlying the layer of semiconductor material, the additional semiconductor material comprising a first semiconductor region having a first conductivity type;
a second semiconductor region located in the additional semiconductor material and having a second conductivity type;
a third semiconductor region located in the additional semiconductor material above the second semiconductor region and having the first conductivity type;
a fourth semiconductor region located in the additional semiconductor material above the third semiconductor region and having the second conductivity type;
a fifth semiconductor region located in the additional semiconductor material above the second semiconductor region and having the second conductivity type, the fifth semiconductor region being adjacent to both the third semiconductor region and the fourth semiconductor region, wherein the fifth semiconductor region electrically couples the second semiconductor region and the fourth semiconductor region to a semiconductor contact region; and
a sixth semiconductor region located in the additional semiconductor material adjacent to the fourth semiconductor region and having the first conductivity type; wherein:
no portion of the second semiconductor region is located under the sixth semiconductor region;
no portion of the third semiconductor region is located under the sixth semiconductor region; and
the fourth semiconductor region separates the fifth semiconductor region from the sixth semiconductor region.

* * * * *